United States Patent

Cronin, III et al.

[11] Patent Number: 5,966,517
[45] Date of Patent: Oct. 12, 1999

[54] SEMICONDUCTOR DEVICE USING DIODE PLACE-HOLDERS AND METHOD OF MANUFACTURE THEREOF

[75] Inventors: Daniel R. Cronin, III, Lake Worth; Ricardo Fernandez, Miami Beach, both of Fla.; Richard J. Swindlehurst, Phoenix, Ariz.

[73] Assignee: Motorola, Inc., Schaumburg, Ill.

[21] Appl. No.: 08/740,766

[22] Filed: Nov. 1, 1996

[51] Int. Cl.$^6$ .................. G06G 7/48; H01L 23/528
[52] U.S. Cl. .................... 395/500.02; 364/488
[58] Field of Search .................. 364/489, 488; 395/500.02, 500.09

[56] References Cited

U.S. PATENT DOCUMENTS

| | | | |
|---|---|---|---|
| 4,989,057 | 1/1991 | Lu | 257/257 |
| 5,212,398 | 5/1993 | Matsunaga et al. | 257/356 |
| 5,426,320 | 6/1995 | Zambrano | 257/328 |
| 5,500,542 | 3/1996 | Iida et al. | 257/210 |
| 5,508,548 | 4/1996 | Tailliet | 257/360 |
| 5,530,612 | 6/1996 | Maloney | 361/56 |
| 5,567,968 | 10/1996 | Tsuruta et al. | 257/356 |
| 5,594,266 | 1/1997 | Beigel et al. | 257/355 |
| 5,637,901 | 6/1997 | Beigel et al. | 257/355 |
| 5,763,918 | 6/1998 | El-Kareh et al. | 257/355 |
| 5,793,069 | 8/1998 | Schuelein et al. | 257/208 |
| 5,811,857 | 9/1998 | Assaderaghi et al. | 257/355 |

FOREIGN PATENT DOCUMENTS 06061440  3/1994  Japan .................. H01L 27/092

OTHER PUBLICATIONS

European Search Report, EP97/118660, dated Feb. 5, 1998.

*Primary Examiner*—Kevin J. Teska
*Assistant Examiner*—Hugh Jones
*Attorney, Agent, or Firm*—J. Gustav Larson

[57] ABSTRACT

In operation, a standard cell library having diode place-holders (16) associated with standard cell inputs (12) is used to design a standard cell-based semiconductor device. Each standard cell in the standard cell-based semiconductor device is analyzed to determine if its standard cell inputs (12) will be connected to a conductive element (18) during processing that can accumulate a charge. When a conductive element (18) that can accumulate charge is identified, the diode place-holder (16) associated with its standard cell input (12) is replaced with a diode (16).

11 Claims, 3 Drawing Sheets

SEMICONDUCTOR DEVICE USING DIODE PLACE-HOLDERS AND METHOD OF MANUFACTURE THEREOF

FIELD OF THE INVENTION

The present invention relates generally to the design of semiconductor devices, and specifically to a method of optimizing a design layout.

BACKGROUND OF THE INVENTION

Antenna diodes are diodes that are inserted in integrated circuit layouts to protect against electrostatic discharge (ESD). ESD may be caused by accumulation of charge on a metal net connected to input gates, or inputs, during manufacturing. These gates often have thin dielectric layers which are damaged by the ESD.

The ESD through a gate dielectric occurs when there is no lower resistance path for the charge to follow. For example, when a metal net that connects to the gate also connects to a drain or source of the integrated circuit, the charge is allowed to dissipate to the diffusion area of the drain or source which provides a lower resistance path, thereby protecting the gate dielectric from the charge. Therefore, antenna diodes are connected to metal lines that otherwise during manufacturing process would be connected to a gate but not to the substrate.

The use of antenna diodes is also used with standard cell libraries. Standard cell libraries include individual standard cells implementing various logical functions. Generally, each standard cell has at least one standard cell input for receiving a signal from another standard cell or external source. These standard cells are pre-designed, and used as a "building blocks" to create a larger standard cell-based design.

At the time a standard cell is designed, it is unknown what a standard cell input will ultimately be connected to. Therefore, it cannot be determined whether an antenna will ultimately be needed because the larger design is not known. Therefore, antenna diodes are connected to each standard cell input gate to assure ESD damage does not occur during manufacturing.

Adding antenna diodes to each standard cell input has several disadvantages. The first is an increase in capacitance associated with the standard cell input. This increase in capacitance results in slower operation and increased current consumption. Second, the diode results in additional current drain. The increased current consumption results in increase power consumption. Therefore, a standard cell library that limits the number of antenna diodes would be desirable.

DETAILED DESCRIPTION OF THE INVENTION

In operation, a standard cell library having diode place-holders associated with standard cell inputs is used to design a semiconductor device. Each standard cell in the semiconductor device is analyzed to determine if its standard cell inputs will be connected to a conductive element during processing that can accumulate a charge. When a conductive element that can accumulate charge is identified, the diode place-holder associated with its standard cell input is replaced with a diode.

Figure 1:
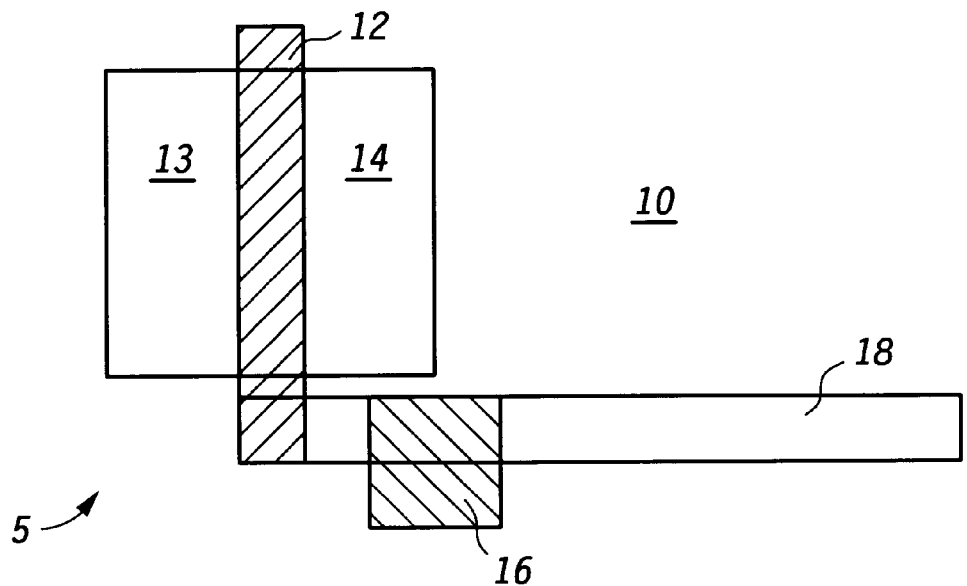
FIG. 1 illustrates, in top-view layout form, a standard cell input having a diode place-holder in accordance with the present invention.
Figure 2:
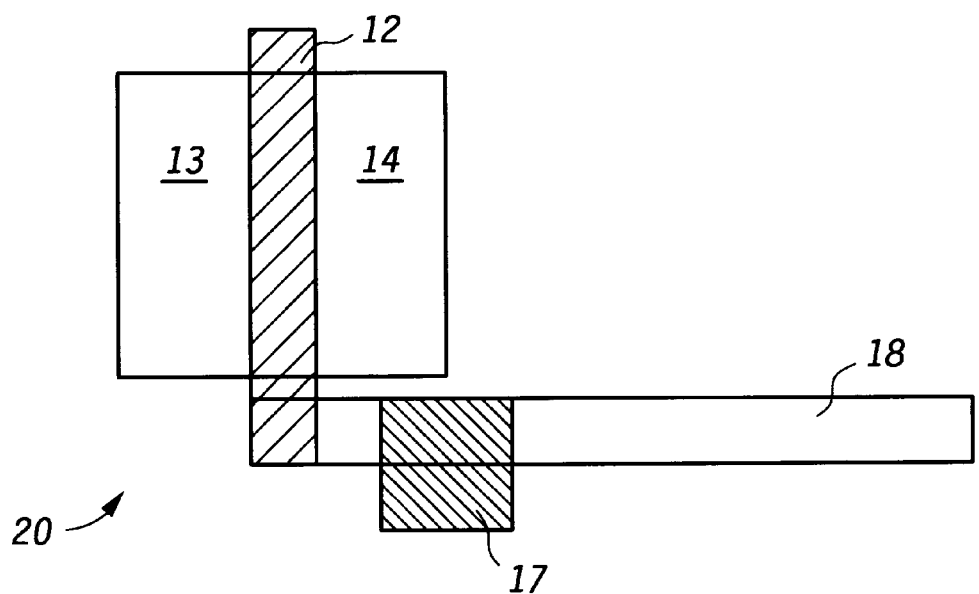
FIG. 2 illustrates, in top-view layout form, a standard cell input having the diode place-holder replaced in accordance with the present invention.

FIG. 1 illustrates a standard cell portion 10 in layout form. The standard cell portion 10 comprising a transistor 5, a conductive net 18, and a diode place-holder 16. The transistor 5 further comprises diffusion regions 13 and 14, and a polysilicon gate 12. The diffusion region 13 can be a drain or an source, while the diffusion region 14 is conversely an source or a drain.

The polysilicon gate 12 is connected to the conductive net 18. Typically the conductive net 18 will be a metal. In one embodiment of the present invention, the conductive net 18 is metal1, which is the first of multiple layers of metal providing interconnectivity for the standard cell portion 10. In the manufacturing process, the metal1 layer is formed after the diffusion regions 13 and 14, and the gate 12.

Following the formation of the net 18, and prior to the formation of other conductive layers, a charge can accumulate on the net 18. If the net 18 is connected to a substrate region, such as an source, drain or diode, the accumulated charge is allowed to discharge. However, if the net 18 does not connect to the substrate, the charge can build on the net 18 until ESD damage occurs across the dielectric region (not shown) between the gate 12 and the substrate below. The ESD can permanently damage the dielectric region resulting in degraded performance or failure of the overall semiconductor device.

Gates associated with finished semiconductor devices are generally connected to a substrate area. However, during the manufacturing process, the connectivity layer providing the connection to a substrate area may not yet be formed. For example, it is possible for a gate to first be connected to a metal1 net and then a metal 2 net, where the metal2 net is also connected to a substrate area providing the connection to the substrate. In this situation, the metal1 net prior to the formation of the metal2 net, will act like an antenna to collect charge. Since the metal2 layer has not yet been formed, the charge can accumulate and discharge across the dielectric region separating the gate 12 from the substrate area below.

In order to accommodate this charge, each standard cell input node that cant be potentially damages is designed with a diode place-holder associated it. The diode place-holder is an object of the standard cell data base that is connected to an input node. The diode place-holder is generally the same size and shape as a diode and "reserves" a location in the standard cell layout for a diode. This allows a determination to be made after the final standard cell-based device layout is known whether a diode should replace the diode place-holder.

Figure 3:
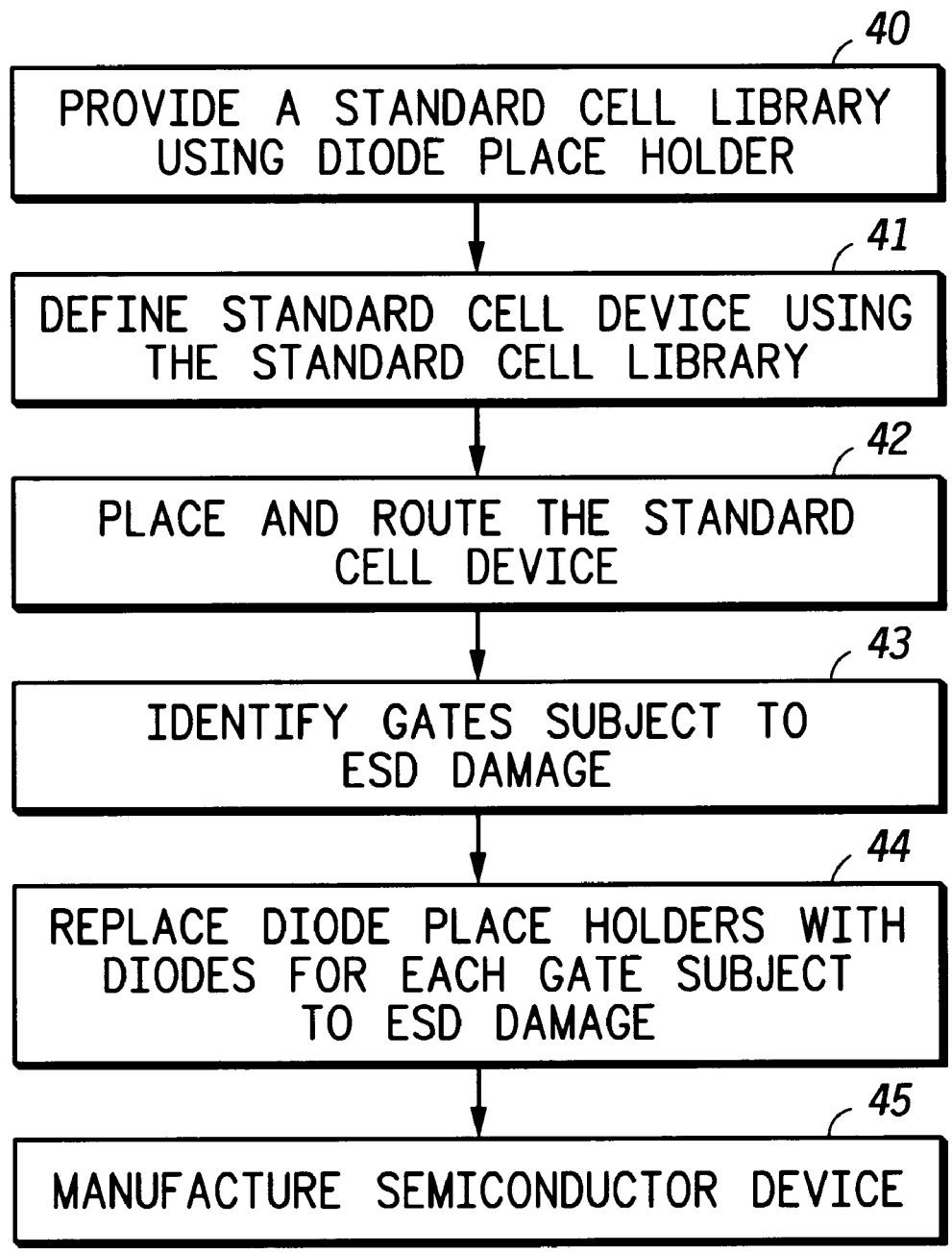
FIG. 3 illustrates, in flow diagram form, a method of using diode placeholders in accordance with the present invention.

FIG. 3 illustrates a method for assuring a substrate path for discharge is available for each standard cell input during the manufacturing process of a standard cell based device. At step 40, a standard cell library is provided. The standard cells in the library have diode place-holders connected to each standard cell input capable of being damaged by ESD.

Next, at step 41, a standard cell-based device is defined. This is accomplished by a designer using the standard cells available in the standard cell library. The standard cell-based device is designed to meet a functional specification.

Next, at step 42, the standard cell based device placed and routed. A placement portion of this step determines where on a semiconductor die standard cells will be located relative to one another. The routing portion of this step connects the outputs of each standard cell to the standard cell inputs they provide signal to; this output to input relationship is specified by the designer.

Next, at step 43, standard cell inputs are identified that are subject to ESD damage. As discussed previously, these inputs will be connected to a conductive object, such as a net which is not connected to a substrate portion of the standard cell-base design. Therefore, the conductive object does not have a discharge path to the semiconductor substrate.

Next, at step 44, a diode replaces the diode place-holder for each input gate that is identified is step 43 as being potentially ESD damaged. This replacement will generally occur in the design database by swapping an diode place-holder indicator with a diode and a via for connecting the diode to the net. In another embodiment, the entire standard cell could be swapped out. For example, a standard cell having no antenna diodes could be replaced by a standard cell having the necessary diode built-in. In yet another example, a first standard cell having diodes associated with each of its inputs could replace a second standard cell have no diodes associated with its input whenever any one input needs a diode. While less efficient, this would guarantee manufacturing integrity while eliminating some unnecessary diodes.

Next, at step 45, the semiconductor device is manufactured using a semiconductor process.

The method of FIG. 3 assures that at each step in the semiconductor manufacturing process that input gates will not be damaged due to charge buildup on individual nets. It should be noted, that while the charge buildup has been described as occurring on a net, the charge buildup could occur on any layer that is capable of maintaining a charge, such as a via.

Figure 4:
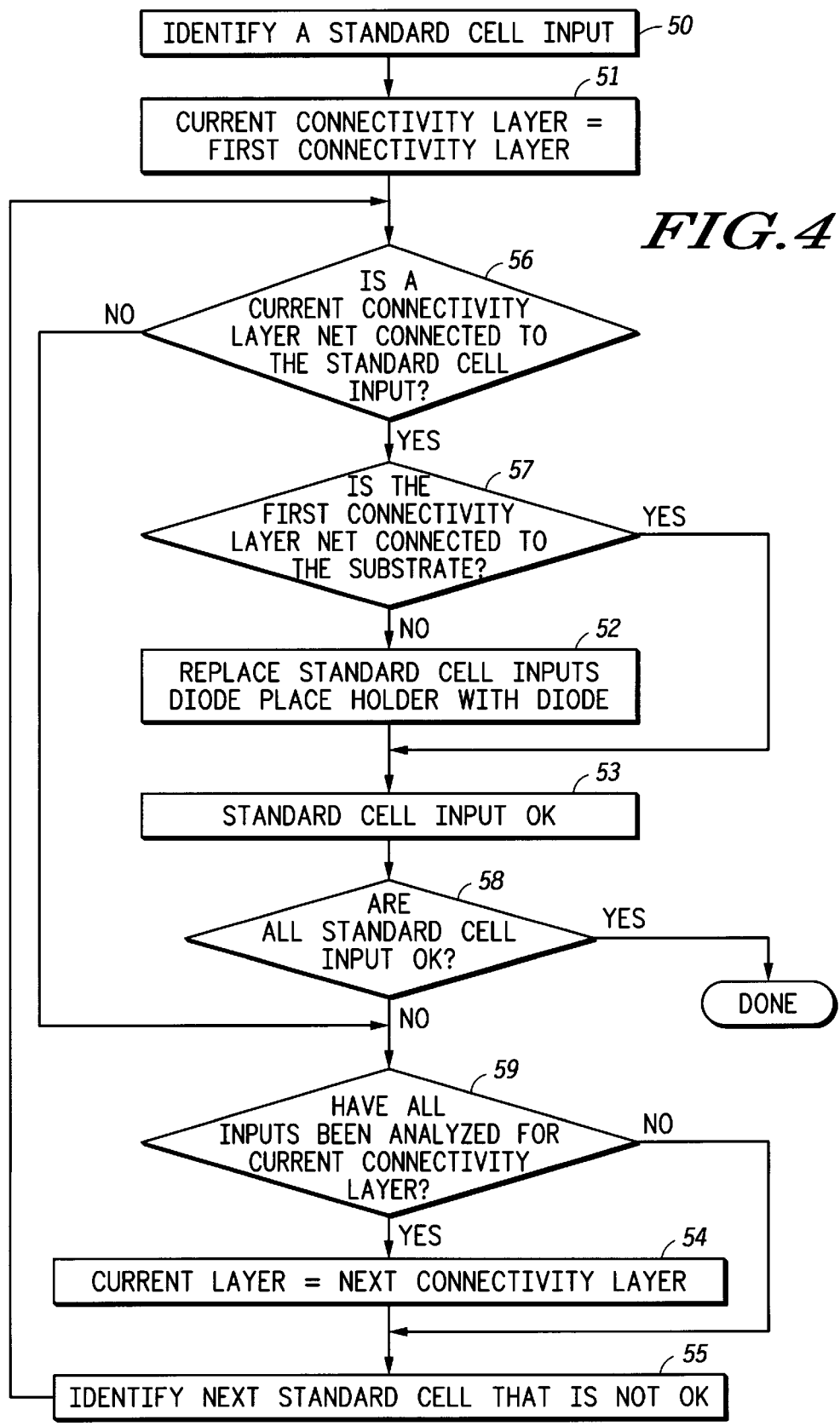
FIG. 4 illustrates, in flow diagram form, a detailed method of a portion of the method of FIG. 3.

FIG. 4 illustrates a method expanding the steps 43 and 44 of identifying which diode place-holders to replace with diodes. At step 50, a specific standard cell input is identified. Next, at step 51, a current connectivity layer is defined to be a first connectivity layer. This layer will generally be a metal1 layer which is the first manufactured layer of metal on a semiconductor device. However, it is understood that other embodiments may have a via layer or other connective layer be the first layer. Which layer is the first layer is dependent upon the design rule specifications of the semiconductor process to be used.

Next, at step 56, a determination is made whether a current connectivity layer net is connected to the standard cell input. Note, that the term net will generally apply to a contiguous metal run, but as previously discussed could apply to a via as well. When no net of the current layer is connected to the input flow proceeds to step 59. When a net of the current connectivity layer is connected to the standard cell input flow proceeds to step 57. At step 57, a determination is made whether the net is connected to the standard cell based semiconductor substrate. If so, no charge can accumulate on the net, and flow proceeds to step 53 where the input is labeled OK. If the net is not connected to the substrate, the potential for charge accumulation exists, and flow proceeds to step 52.

At step 52, the diode place-holder associated with the input is replaced with a diode. This assures that for any all processing steps, that charge buildup is dissipated to the substrate and not through the gate. Next, at step 53 the standard cell input is labeled OK, as the gate is now assured not to be damaged by ESD as previously described. Next, at step 58, a determination is made whether all standard cell inputs of the standard cell-based device are labeled OK. If so, no input remain that can be damaged by ESD, and the method of FIG. 4 is done. If not, other nets need to be analyzed and flow continues to step 59.

At step 59, a determination is made whether remaining standard cell inputs that are not labeled OK have been analyzed respective to the current connectivity layer. If not, flow proceeds to step 55. If so, flow proceeds to step 54 where the current layer is defined to be the next connectivity layer. As previously discussed, the next connectivity layer will be defined by the design rules, but will generally be the next process layer of metal, such as metal2, metal3, etc.

Next, at step 55, a standard cell that has not yet been marked OK is identified, and the flow proceeds to step 56 until all standard cell input have been labeled OK.

It should now be obvious that by using a zero-capacitance diode placeholder, that semiconductor devices having increased performance and yield can be realized.

While the present invention has been illustrated and described with reference to specific embodiments, further modifications and improvements will occur to those skilled in the art. For example, the diode could be in a substrate region or a well region, or that semiconductor devices not fabricated in silicon could be used, or yet further, the diode place-holder could be larger than the diode place. It is to be understood, therefore, that this invention is not limited to the particular forms illustrated herein and that the appended claims cover all modifications that do not depart from the scope and spirit of this invention.

We claim:

1. A method of manufacturing a semiconductor device comprising:

receiving a semiconductor device design file having an input, a diode place-holder, and an interconnect layer;

determining, based on the semiconductor device design file, if the input is coupled to an interconnect layer object meeting a size requirement, wherein the step of determining is true when the interconnect layer object meets the size requirement;

replacing the diode place-holder with a diode in the semiconductor device design file when the step of determining is true, otherwise leaving the diode place-holder when the step of determining is not true; and manufacturing the semiconductor device based on the semiconductor device design file.

2. The method of claim 1, wherein the size requirement specifies an area of the interconnect layer object.

3. The method of claim 1, wherein the size requirement specifies a length of the interconnect layer object.

4. The method of claim 1, wherein the size requirement specifies a quantity associated with the interconnect layer object.

5. The method of claim 1, wherein semiconductor device is a standard cell-based semiconductor device.

6. A method of manufacturing a semiconductor device comprising:

receiving a design file comprising a first transistor having an input gate, a source and a drain, a node coupled to a semiconductor substrate, an interconnect layer, and a diode place-holder;

determining, based on the design file, if the input gate is connected via the interconnect layer to the node, wherein the step of determining is true when the input gate is connected via the interconnect layer to the node, otherwise the step of determining is false;

replacing the diode place-holder with a diode in the design file when the step of determining is false to produce a modified design file; and manufacturing the semiconductor device based on the modified design file.

7. A method of manufacturing a semiconductor device comprising:

receiving a design file having a first transistor having an input, a source and a drain, an electrode coupled to a semiconductor substrate, an interconnect layer, and a diode place-holder;

determining, based on the design file, if the input is coupled via an object of the interconnect layer to the electrode and if the object of the interconnect layer meets a size specification, wherein the step of determining is true when the input is connected to the electrode via the object of the interconnect layer and the object of the interconnect layer meets the size specification; and placing a diode in a same location of the diode place-holder when the step of determining is false.

8. A method of designing a semiconductor device comprising the steps of:

providing a standard cell library comprising a plurality of standard cells, each of the plurality of standard cells having an input gate for receiving a signal from another standard cell, wherein the input gate of each of the plurality of standard cells is coupled to a diode place-holder;

providing a semiconductor design file based on the standard cell library;

performing an antenna check to determine which input gates of the plurality of standard cells are subject to accumulated charge during manufacturing; and replacing the diode place-holder coupled to the input gates subject to accumulated charge during manufacturing with diodes.

9. A standard cell library comprising a plurality of standard cells, wherein at least one of the plurality of standard cells comprises a standard cell input and a diode place-holder associated with the standard cell input such that an optional diode placed in the diode place-holder location is coupled to the standard cell input.

10. The standard cell library of claim 9, wherein the diode place-holder is substantially a same shape as the optional diode.

11. The standard cell library of claim 9, wherein one of the plurality of standard cells comprises a plurality of input gates, each of the plurality of input gates having a diode place-holder.

* * * * *